Jan. 12, 1971 D. L. WILCOX 3,555,431

ALL ELECTRONIC VHF TELEVISION TUNER

Filed Dec. 30, 1966 2 Sheets-Sheet 1

INVENTOR:
DONALD L. WILCOX

E. Mickey Hubbard
ATTORNEY

ALL ELECTRONIC VHF TELEVISION TUNER

Filed Dec. 30, 1966

United States Patent Office 3,555,431

Patented Jan. 12, 1971

3,555,431

ALL ELECTRONIC VHF TELEVISION TUNER

Donald L. Wilcox, Richardson, Tex., assignor to Texas Instruments Incorporated, Dallas, Tex., a corporation of Delaware Filed Dec. 30, 1966, Ser. No. 606,315

Int. Cl. H04b *1/16*

U.S. Cl. 325—465 16 Claims

ABSTRACT OF THE DISCLOSURE

Disclosed are digital VHF television tuners for electronically selecting one of a plurality of channels that utilizes switching diodes, such as surface oriented PIN diodes, to selectively couple a plurality of parallel connected, band-pass filter circuit means between the RF signal translating means of the tuner and the IF signal translating means of the tuner. The band-pass filter circuit means of the tuner may include a plurality of parallel connected tuned transformers for preferentially passing filtered selected RF signals from the RF amplifier stage to the mixer stage, and may also include a plurality of tuned filter circuits for each channel electrically coupled at the input of the RF amplifier stage and a plurality of frequency determining networks for each frequency of the local oscillator. The band-pass filter means and the frequency determining circuits are selectively coupled into the circuit of the tuner by forward biasing a selected one of the switching diodes utilizing either DC current passed through the tuned circuits and the respective switching diodes or utilizing a DC current passed in shunt with the tuned circuits and the respective switching diode.

This invention relates generally to VHF receivers, and more particularly relates to a VHF television receiver tuner in which the channels are electronically selectable as opposed to mechanically selectable.

In the two decades that television sets have been sold commercially, every set has used a tuner having rotating multicontact mechanical switches for channel selection. Because very high frequencies are involved, typically from about 54 megacycles to about 216 megacycles, a large number of frequency sensitive electronic components must be clustered around the rotary switch, and for each different channel, several different electronic components must be connected into the circuit. As a result, a typical thirteen channel tuner has over one hundred sets of mechanical contacts and is relatively large and complex.

The channel selector knob must protrude from the cabinet, usually from the front or top, so that it can be manually operated. The large size of the tuner together with the required location of the tuner often interferes with the aesthetic design of the cabinet. In addition, the intermediate frequency from the tuner must be transferred over substantial distances to the remainder of the television circuit by transmission cables, which creates problems and requires compromises in circuit design. The mechanical switches are susceptible to failure due to dirty, corroded, bent or broken contacts, mechanical wear, or loss of contact pressure. The multicontact switch and the associated hardware are economically expensive. Because of the number of mechanical contacts involved and the pressure required to insure good mechanical contact, the torque required to rotate the shaft is relatively high, which is unpleasant for manual selection, and also requires an electric motor or solenoid for remote selection. In addition, the mechanical switches are objectionable because of the noise created during channel selection.

This invention is concerned with an all electronic, solid-state VHF television tuner having no moving mechanical parts. The channels may be selected merely by applying a selected voltage to the selected channels by means of a simple D.C. switch, such as a conventional rotary switch, push-button switch or an electronic switch for remote channel selection. The all electronic tuner has the operational advantages of instant channel changing and silent operation. From a design and cost standpoint, the all electronic tuner has reduced size and weight, greatly increased reliability and useful life as a result of the elimination of the mechanical switch, and a lower cost as the result of the elimination of complex and expensive hardware. The tuner permits the elimination of a motor or solenoid for driving the rotary switch during remote channel selection. Further, the packaging of the television receiver is significantly simplified in that the tuner can be located with the remaining components of the television receiver, rather than at the front of the cabinet.

These and other objects and advantages are achieved in accordance with the present invention by utilizing switching diodes to selectively couple the necessary band-pass filter circuits into the tuner crcuit. More specifically, the switching diodes are PIN diodes having heavily doped p-type and n-type regions separated by an intrinsic, or high resistivity, region. The invention also contemplates a specific tuner circuit design in which a separate double tuned transformer is provided to preferentially pass the filtered radio frequency signal from the RF amplifier stage to the mixer stage, a separate tuned filter circuit is provided for each channel at the input of the RF amplifier stage, and a separate frequency determining network is provided for each frequency of the local oscillator. The separate filter and frequency determining circuits are selectively coupled into the circuit by forward biasing the appropriate switching diode, either with a D.C. current passed through the tuned circuits and the appropriate switching diodes, or with a D.C. current passed in shunt with the tuned circuits and through the appropriate switching diode.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figures 1, 3:
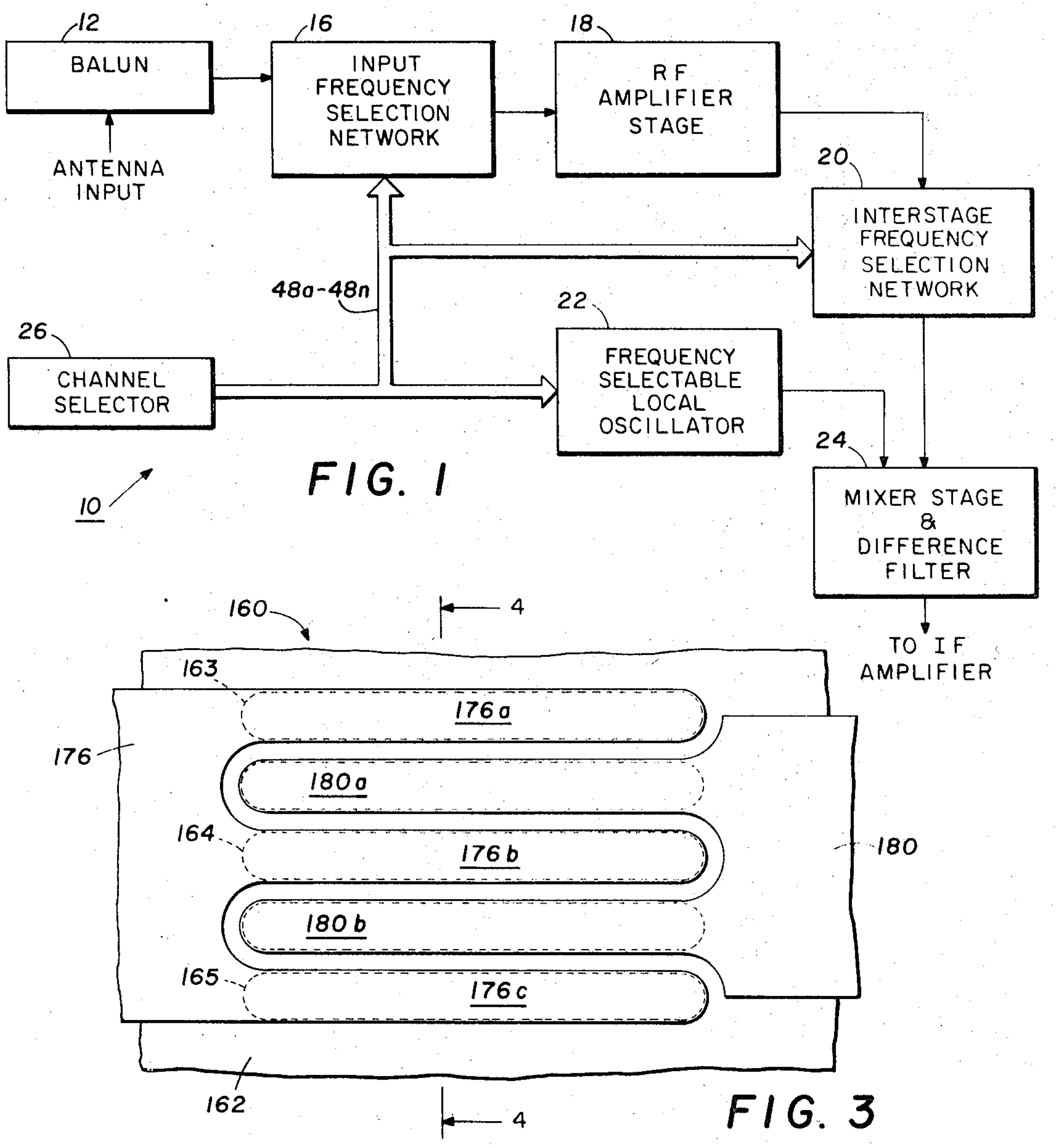
FIG. 1 is a block diagram of a VHF television tuner in accordance with the present invention.
FIG. 3 is a plan view of a high frequency PIN switching diode used in the circuit of FIG. 2.
Figure 4:
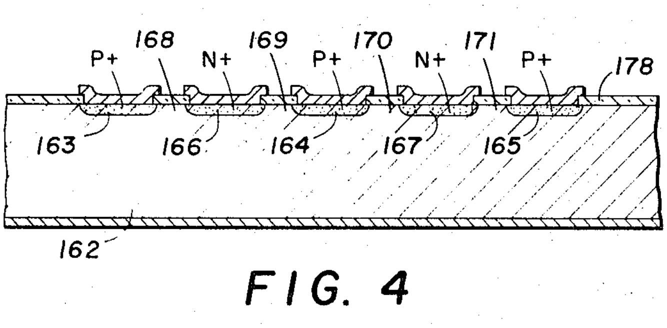
FIG. 4 is a sectional view taken substantially on lines 4—4 of FIG. 3.

Referring now to the drawings, and in particular to the block diagram of FIG. 1, a VHF television tuner in accordance with this invention is indicated generally by the reference numeral 10. The tuner 10 includes a balun 12 which is coupled through an input frequency selection network 16 to the input of an RF amplifier stage 18. The output of the amplifier stage 18 is coupled by an interstage frequency selection network 20 to the input of a mixer stage 24. The output of a frequency selectable local oscillator 22 is also coupled to the input of the mixer stage 24. The output of the mixer stage 24, which includes a filter for selecting the frequency that is the difference between the frequencies of two input signals, is coupled to the IF amplifier of the television receiving set. A channel selector 26 is provided to control the operation of the input frequency selection network 16, the interstage frequency selection network 20, and the frequency selectable local oscillator 22.

Figure 2:
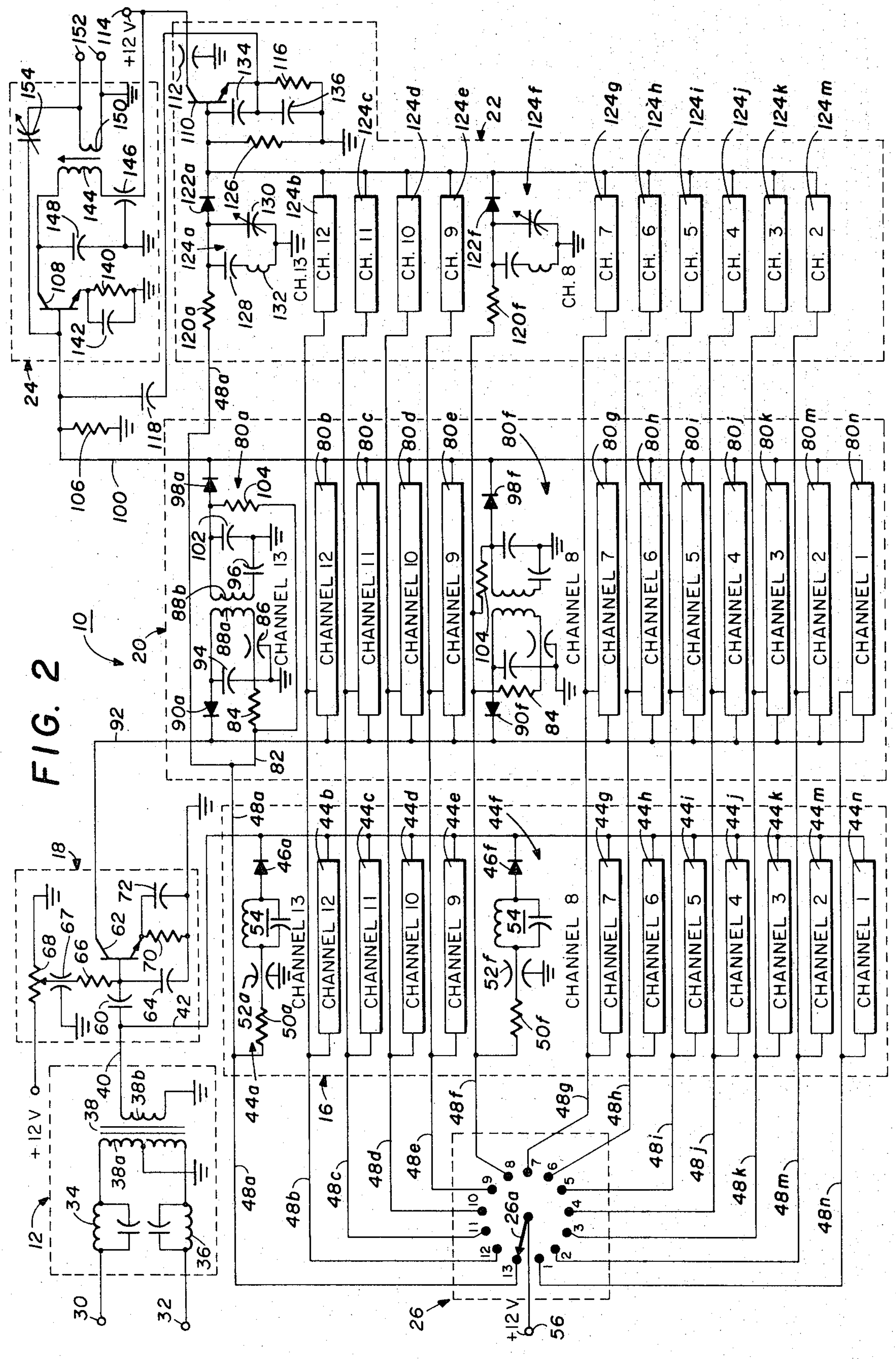
FIG. 2 is a more detailed schematic circuit diagram of the tuner of FIG. 1.

The components indicated in the block diagram of FIG. 1 are indicated in dashed outline and designated by the same reference characters in the more detailed schematic diagram of FIG. 2.

The radio frequency signal from the antenna is applied to inputs 30 and 32 of the balun circuit 12. The balun circuit 12 is of conventional design and is used to convert a balanced antenna signal to an unbalanced signal suitable for use by the RF amplifier stage 18. Thus, the inputs 30 and 32 are coupled through LC circuits 34 and 36 to the terminals of the primary winding 38*a* of a transformer 38. The center tap of the primary winding 38*a* is grounded. One terminal of the secondary winding 38*b* is connected to ground, and the other is connected by conductor 40 to conductor 42 of the input frequency selection network 16. Of course, it will be appreciated that the signals applied to inputs 30 and 32 include those signals resulting from all electromagnetic radiation striking the antenna. However, the LC circuits 34 and 36 are tuned to reject those VHF signals in the television intermediate frequency band, which are from 41 mHz. up to 47 mHz.

The input frequency selector network 16 is comprised of thirteen tuned LC filter circuits indicated generally by the reference numerals 44*a*–44*n*, each being tuned to one of the thirteen VHF television channels. Filter circuit 44*a*, for example, is tuned to the channel 13 band from 210–216 mHz., filter circuit 44*f* is tuned to the channel 8 band from 180–186 mHz., and filter circuit 44*n*, which is the UHF channel, is tuned to the IF frequency of 41–47 mHz. The UHF channel 1 is utilized in conection with a conventional UHF antenna coupled to the RF amplifier stage 18. Each of the thirteen tuned circuits 44*a*–44*n* is of the same circuit configuration, a simple LC circuit 54, although the electronic values of the individual components are changed in order to achieve the desired pass band. The filter circuits 44*a*–44*n* are coupled to the conductor 42 and thus to the secondary windings 38*b* by PIN switching diodes 46*a*–46*n*, respectively, and are coupled to ground by feedthrough capacitor 52 to complete an A.C. loop with the secondary winding 38*b*. Each of the diodes 46*a*–46*n* can be selectively forward biased by a D.C. current applied through a series circuit including conductors 48*a*–48*n*, resistors 50*a*–50*n*, the feedthrough capacitors 52*a*–52*n*, the respective LC circuits and diodes, conductors 42 and 40, and the secondary winding 38*b*.

The channel selector 26 may comprise any suitable D.C. switch such as one having thirteen contacts numbered to correspond to the channels, and a wiper 26*a*, which is connected to a +12 volt source and can be manually or otherwise positioned at any one of the thirteen contacts. Any push-button or other type manual D.C. switch may be employed, if desired. The contacts 13–1 are connected to conductors 48*a*–48*n*, respectively, so that only one of the switching diodes 46 can be forward biased at any one time.

The junction between conductors 40 and 42, which may be considered as the output from the network 16, is coupled by capacitor 60 to the base of transistor 62, which is the RF amplifier stage 18. The base of transistor 62 is also coupled by capacitor 64 to ground for impedance matching purposes. The D.C. bias, which controls the gain of the amplifier stage 18, is supplied from voltage divider 68 through feedthrough capacitor 67 and resistor 66. An automatic gain control signal may be applied through resistor 66 if desired. The emitter of transistor 62 is connected through a resistor 70 and a capacitor 72 to ground. The collector of transistor 62 is the output terminal of the amplifier stage 18.

The interstage frequency selection network 20 is comprised of thirteen double-tuned over-coupled broad band transformers indicated generally by the reference numerals 80*a*–80*n*. Each of the transformers 80*a*–80*n* has the same circuit configuration, and accordingly corresponding components are designated by corresponding reference numerals. However, the components of transformers 80*a*–80*n* have different values so as to be tuned to the frequency bands corresponding to channels 13–1, respectively. Depending upon the channel selected, one of the transformers 80*a*–80*n* couples the output of the amplifier stage 18 to the input of the mixer stage 24.

Each of the transformers 80*a*–80*n* has a primary winding 88*a* and a secondary winding 88*b* which are inductively coupled. Each of the primary windings 88*a* together with a capacitor 94 forms a first filter circuit tuned to the frequency of the respective channels. Similarly, each of the secondary windings 88*b* together with capacitors 102 and 96 forms a second filter circuit tuned to the frequency of the respective channels. The filter circuits are coupled to the collector of transistor 62 by PIN switching diodes 90*a*–90*n*, respectively, and conductor 92. Any one of the diodes 90*a*–90*n* can be selectively forward biased by D.C. current applied through the approriate conductors 48*a*–48*n*, and the corresponding resistor 84, feedthrough capacitor 86, primary winding 88*a*, the diodes 90*a*–90*n* and conductor 92. The current used to forward bias the particular switching diode 90*a*–90*n* is the collector current for the transistor 62. The second filter circuits are connected through PIN switching diodes 98*a*–98*n*, respectively, to an output conductor 100, which is connected to the base of the mixer transistor 108. Any one of the switching diodes 98*a*–98*n* can be selectively forward biased by a D.C. potential applied to one of the conductors 48*a*–48*n* so that current will flow through the resistor 104, which is connected in shunt to the filter circuit, through the respective diodes 98*a*–98*n*, and through resistor 106 to ground. The resistor 104 and the resistor 106 form a voltage divider which establishes the D.C. bias level of transistor 108.

The local oscillator 22 produces a sine wave signal having a frequency equal to the center frequency of the selected channel plus the intermediate frequency which is produced at the output of the mixer 24, typically 44 mHz. The local oscillator is comprised of a transistor 110 the collector of which is connected through a feedthrough capacitor 112 to the voltage supply terminal 114. The emitter of transistor 110 is connected through resistor 116 to ground. The emitter of transistor 110 is also coupled to its base by capacitor 134 and to ground by capacitor 136 to provide the feedback necessary for oscillation. The emitter of transistor 110 is the output of the local oscillator and is coupled to the base of the mixer transistor 108 by capacitor 118. The bias voltage for the base of transistor 110 is supplied from the positive voltage terminal 56 through the channel selector switch 26 and through one of the conductors 48*a*–48*m* to one of twelve frequency selection circuits 124*a*–124*m* and is developed across resistor 126. Each of the frequency selection circuits 124*a* and 124*m* includes an inductance 132 and capacitors 128 and 130, the latter being adjustable to provide fine tuning. The D.C. current from conductors 48*a*–48*m* pass through resistors 120*a*–120*m*, which are in shunt to the LC circuits, and through PIN switching diodes 122*a*–122*m*.

The two signals, one from the interstage network 20 and the other from the local oscillator 22, are heterodyned across the nonlinear emitter-base diode junction of mixer transistor 108. The emitter of transistor 108 is connected through resistor 140 and through capacitor 142 to ground. The collector is connected through the primary winding 144 and a feedthrough capacitor 146 to the positive voltage supply terminal 114, and by capacitor 148 to ground. The feedthrough capacitor 146 is also connected to ground. The secondary winding 150 places the output of the mixer at the terminals 152 which are connected to the IF amplifier of the television system. One of the terminals 152 is also coupled by a variable neutralizing capacitor 154 back to the base of transistor 108. The design and operation of mixers are well known.

The PIN switching diodes 46a–46n, 90a–90n, 98a–98n and 122a–122m must have the characteristics of being good short circuits when forward biased "on," typically having an impedance less than about ten ohms, and good open circuits when zero or reverse biased "off," typically having an impedance greater than about five thousand ohms. In addition, the current required to forward bias the diodes to the "on" state should be reasonably small, for example, less than about two milliamperes. In accordance with an important specific aspect of this invention, the switching diodes 46, 90, 98 and 122 are silicon PIN diodes. An example of such a diode is illustrated in plan view in FIG. 3 and is indicated generally by the reference numeral 160. The diode is formed in a high resistivity silicon substrate 162 typically having a resistivity greater than 500 ohm-cm. although high resistivity gallium arsenide may also be employed. The resistivity of the silicon substrate need only be high enough to provide punch through under reverse bias and reduce the metal-oxide-semiconductor (MOS) capacitance to a sufficiently low value at the VHF frequencies. Three heavily doped p-type diffused regions 163, 164 and 165 are formed in the surface of the substrate 162. The p-type diffused regions may be formed by boron diffused to the maximum practical surface concentration, typically about $10^{19}$ atoms/cc. The diffusions are relatively shallow, being typically from about one to about twenty lines deep, each line being about 0.000011 inch deep. A heavily doped n-type diffused region 166 is formed between the p-type diffused regions 163 and 164, and a heavily doped, n-type region 167 is formed between the p-type diffused regions 164 and 165. The n-type regions 166 and 167 are formed by the same n-type diffusion to the same depth as the p-type diffusion. The n-type impurity may be phosphorus with a surface concentration of about $10^{20}$ atoms/cc. The diffused regions are so spaced as to leave high resistivity regions 168–171 between the adjacent edges of the p-type and n-type regions. The spaces between the edges of the diffused region are typically about 0.0003 inch. Contact is made with the p-type diffused regions 163–165 by the finger portions 176a–176c of a metalized contact 176 which pass through openings formed in the oxide insulating layer 178 into ohmic contact with the diffused regions. Similarly, contact is made with the n-type regions 166 and 167 by the fingers 180a and 180b of a metallized film 180 which extend through openings in the oxide layer 178. The metallized films 176 and 180 may be vapor deposited at the same time and subsequently patterned using conventional techniques, and may be a laminate of gold overlying an extremely thin film of a metal having a high eutectic temperature with silicon, such a molybdenum, vanadium, platinum, nickel or tungsten. Such a laminate will prevent the eutectic intermixing of gold with the silicon which tends to cause undesirable structure. Thus, it will be noted that the PIN diode is surface oriented and has a PIN (p-type, intrinsic, n-type) construction formed between the adjacent edges of the p- and n-type diffused regions. As a result of the very high resistivity of the intrinsic substrate 162, the diode has a high resistivity when reverse biased. As a result of the very small opposed areas of the diffused regions, the diode has a very low capacitance suitable for use in the VHF frequency range of television channels.

In the operation of the tuner 10, assume that the channel selector 26 is operated so as to select channel 13. The positive twelve-volt terminal 56 is then connected by the sliding contact 26a to contact 13 and thus to conductor 48a. The other contacts 1–12 are open. As a result, switching diode 46a is forward biased by a D.C. current passing through resistor 50, feedthrough capacitor 52, the inductor of the LC circuit 54, diode 46a, conductors 42 and 40, and the secondary winding 38b. The switching diodes 46b–46n of the remaining filter circuits 44b–44n are zero biased. Similarly, switching diode 90a is forward biased by current from conductor 48a which passes through resistor 84, feedthrough capacitor 86, primary winding 88a, and diode 90a to the collector of transistor 62. The other diodes 90b–90n are zero biased. Switching diode 98a is forward biased by a D.C. current through conductor 48a, resistor 104, diode 98a and resistor 106, while the other diodes 98b–98n are zero biased. Switching diode 122a is also forward biased by a D.C. current from conductor 48a which passes through resistor 120a, diode 122a and resistor 126. The remaining switching diodes 122b–122m of the frequency selection circuits 124b–124m are zero biased.

Thus, the incoming radio frequency signals developed across inputs 30 and 32 are impressed upon the D.C. current passing from conductor 48a through the LC circuit 54, the switching diode 46a and the secondary winding 38b. Since the LC circuit 54 is tuned to the channel 13, the frequency band from 210 to 216 mHz. is coupled to the base of transistor 62 by capacitor 70 and the remaining portion of the frequency spectrum is attenuated. Capacitors 60 and 64 perform an impedance matching function, and resistor 66 prevents the shorting of the A.C. signal to ground through the feedthrough capacitor 67.

The collector current for the transistor 62 is provided from conductor 48a through resistor 84, the first filter circuit of transformer 80a, and switching diode 90a. This D.C. current is modulated by the prefiltered signal coupled to the base of transistor 62. The signal impressed upon the collector current of the transistor 62 is further filtered by the first filter circuit of the transformer 80a to further reject that position of the frequency spectrum outside the channel 13 band. The modulated current through the primary winding 88a induces a corresponding A.C. signal in the secondary winding 88b which is impressed upon the D.C. emitter through diode 98a, and thus modulates the voltage developed across resistor 106. Since secondary winding 88b froms a part of a second filter circuit, which is also tuned to the channel 13, the frequencies outside the channel 13 frequency band are further rejected and at this point all frequencies outside the channel 13 frequency band have been attenuated to the extent necessary.

Since conductor 48a is at a positive twelve volts, the D.C. bias level for the base of the local oscillator transistor 110 is derived through resistor 120a and diode 122a and is developed across resistor 126. Then as a result of the feedback through capacitors 134 and 136, frequency selection circuit 124a, together with the capacitors 134 and 136 results in the voltage at the emitter of transistor 110 being modulated sinusoidally at a frequency equal to the center frequency of the channel 13 frequency band, which is 213 mHz., plus the intermediate frequency, which is 44 mHz. Thus, for channel 13, the local oscillator 22 produces an injection voltage at a frequency of 257 mHz.

The A.C. voltage signal developed across resistor 116 is coupled through capacitor 118 and injected along with the R.F. signal from the channel 13 transformer 80a at the base of the mixer transistor 108 where the two signals are heterodyned across the nonlinear emitter-base diode junction of transistor 108. Only the difference signal is selected by the tuned circuit formed by the primary winding 144 and the capacitor 148 in the collector output. As a result, the IF signal is centered around 44 mHz. The operation of the mixer is conventional and will not be described in greater detail.

The operation of the turner 10 is essentially the same for the other channels. For example, if the channel selector 26 is placed on channel 8, then conductor 48f supplies current which will forward bias switching diodes 46f, 90f, 98f, and 122f, and all of the other switching diodes will by zero biased so that filter circuit 44f, transformer 80f and frequency selection circuit 124f will all be coupled into the tuner, while the other tuned circuits will be decoupled. As previously mentioned, channel 1 is customarily used for UHF reception, and circuits 44n, and 80n are tuned to the intermediate frequency of 44 mHz.

Although a preferred embodiment of the invention relating to a VHF television tuner has been described, it is to be understood that within the broader aspects of the invention the tuner may be used for other VHF applications. Thus, although a preferred embodiment of the invention has been described in detail, it is to be understood that various changes, substitutions and alterations can be made therein without departing from the spirit and scope of the invention as defined by the appended claims.

What is claimed is:

1. A digital VHF television tuner for selecting one of a plurality of channels having an RF transistor amplifier stage and a transistor mixer stage, a transformer for each channel, each transformer having a primary winding forming a part of a first band-pass filter circuit means tuned to the frequency of the respective channel and a secondary winding forming a part of a second band-pass filter circuit means tuned to the frequency of the respective channel, a PIN switching diode for each of the first band-pass filter circuit means coupling the respective first band-pass filter circuit means to the collector of the RF transistor amplifier stage when forward biased and decoupling the filter circuit means when biased off, a PIN switching diode for each of the second band-pass filter circuit means coupling the respective second band-pass filter circuit means to the base of the transistor mixer stage, and channel selection means for selectively forward biasing the PIN switching diodes coupling the first and second band-pass filter circuit means of each transformer.

2. The digital VHF television tuner defined in claim 1 wherein each of the first band-pass filter circuit means comprises the primary winding and a parallel capacitor coupled to the collector of the RF transistor amplifier stage by the PIN switching diode, and the channel selection means for forward biasing each PIN switching diode includes a series circuit comprised of a resistor connected through a feedthrough capacitor to the primary winding, the primary winding of the PIN switching diode and the collector of the RF transistor amplifier stage whereby the channel selection means provides the collector current for the RF transistor amplifier stage through the PIN switching diode.

3. The digital VHF television tuner defined in claim 1 wherein each of the second band-pass filter means comprises the secondary winding and a parallel capacitance coupled by the PIN switching diode to the base of the transistor mixer stage, and the channel selection means includes a series circuit comprised of a resistance and the PIN switching diode for the respective second filter circuit means.

4. The digital VHF tuner defined in claim 1 further characterized by an input transformer having a secondary winding coupled to the base of the RF transistor amplifier stage, an input band-pass filter circuit means for each channel tuned to the respective channel frequency, a PIN switching diode for each input band-pass filter circuit means coupling the respective band-pass filter circuit means to the transistor base when biased on and decoupling the respective band-pass filter circuit means from the transistor base when biased off, and wherein the channel selection means includes means for selectively forward biasing the PIN switching diode to selectively couple the corresponding input band-pass filter circuit means to the transistor base.

5. The digital VHF tuner defined in claim 4 further characterized by a local oscillator having an output coupled to the base of the mixer transistor, the local oscillator including a transistor, a feedback network intercoupling the output and the base of the local oscillator transistor, and a frequency selection network for each channel, each frequency selection network being adapted to coact with the feedback network when coupled to the base of the local oscillator transistor to cause the local oscillator to produce a sine wave signal at a frequency equal to the respective channel frequency plus the intermediate frequency of the television system, a PIN switching diode for each frequency selection network coupling the respective frequency selection network to the base of the local oscillator transistor, and wherein the channel selection means includes means for selectively forward biasing the PIN switching diodes coupling the frequency selection network to the base of the local oscillator transistor for the channel selected.

6. A digital VHF television tuner for selecting one of a plurality of channels having an RF transistor amplifier stage and a transistor mixer stage, a transformer for each channel, each transformer having a primary winding forming a part of a first band-pass filter circuit means tuned to the frequency of the respective channel and a secondary winding forming a part of a second band-pass filter circuit means tuned to the frequency of the respective channel, a switching diode for each of the first band-pass filter circuit means coupling the respective first band-pass filter circuit means to the collector of the RF transistor amplifier stage when forward biased and decoupling the filter circuit means when biased off, a switching diode for each of the second band-pass filter circuit means coupling the respective second band-pass filter circuit means to the base of the transistor mixer stage, and channel selection means for selectively forward biasing the switching diodes coupling the first and second band-pass filter circuit means of each transformer.

7. The digital VHF television tuner defined in claim 6 wherein each of the first band-pass filter circuit means comprises the primary winding and a parallel capacitor coupled to the collector of the RF transistor amplifier stage by the switching diode, and the channel selection means for forward biasing each switching diode includes a series circuit comprised of a resistor connected through the feedthrough capacitor to the primary winding, the primary winding of the switching diode and the collector of the RF transistor amplifier stage whereby the channel selection means provides the collector current for the RF transistor amplifier stage through the switching diode.

8. The digital VHF television tuner defined in claim 6 wherein each of the second band-pass filter means comprises the secondary winding and a parallel capacitance coupled by the switching diode to the base of the transistor mixer stage, and the channel selection means includes a series circuit comprised of a resistance and the switching diode for the respective second filter circuit means.

9. The digital VHF tuner defined in claim 6 further characterized by an input transformer having a secondary winding coupled to the base of the RF transistor amplifier stage, an input band-pass filter circuit means for each channel tuned to the respective channel frequency, a switching diode for each input band-pass filter circuit means coupling the respective band-pass filter circuit means to the transistor base when forward biased and decoupling the respective band-pass filter circuit means from the transistor base when biased off, and wherein the channel selection means includes means for selectively forward biasing the switching diode to selectively couple the corresponding input band-pass filter circuit means to the transistor base.

10. The digital VHF tuner defined in claim 9 further characterized by a local oscillator having an output coupled to the base of the mixer transistor, the local oscillator including a transistor, a feedback network intercoupling the output and the base of the transistor, and a frequency selection network for each channel, each frequency selection network being adapted to coact with the feedback network when coupled to the base of the transistor to cause the local oscillator to produce a sine wave signal at a frequency equal to the respective channel frequency plus the intermediate frequency of the television system, a switching diode for each frequency selection network coupling the respective frequency selection network to the base of the local oscillator transistor, and wherein the channel selection means includes means for selectively forward biasing the switching diodes coupling the frequency selection network to the base of the local oscillator transistor for the channel selected.

11. In a digital VHF tuner having a plurality of channel frequencies, the combination of:

an input transformer for receiving an antenna signal having a secondary winding, a plurality of input band-pass filter means each tuned to one channel frequency, a switching diode and a feedthrough capacitor coupling each input filter circuit means across the secondary winding of the input transformer such that each of the input filter circuit means will be A.C. coupled across the secondary winding when the respective switching diode is forward biased by a D.C. current applied through the feedthrough capacitor and the D.C. current will be modulated with the A.C. signal impressed on the secondary winding of the input transformer within the pass band of the input band-pass filter means, an RF transistor amplifier stage having an input A.C. coupled to the secondary winding of the input transformer such that the A.C. modulation of the D.C. current through the secondary winding will be applied to the input of the RF amplifier stage, an interstage frequency selection network including a transformer for each frequency channel having a primary and a secondary winding, the primary winding of each transformer forming a part of a first band-pass filter circuit means tuned to the respective channel frequency and the secondary winding of each transformer forming a part of a second band-pass filter circuit means tuned to the respective channel frequency, a switching diode and feedthrough capacitor A.C. coupling each of the first filter circuit means across the amplifier stage such that a D.C. current applied through the feedthrough capacitor will forward bias the respective switching diode and supply collector current to the transistor amplifier stage, a mixer having an input and an output for producing at the output a signal having a frequency equal to the difference in the frequencies of two signals applied to the input to thereby produce an intermediate frequency, a switching diode for each of the second band-pass filter circuit means connecting the respective second band-pass filter circuit means to the input of the mixer when the switching diode is forward biased by a D.C. current, a local oscillator having an output coupled to the input of the mixer and having a tuned frequency determining network for each channel frequency for producing a frequency at the output of the local oscillator equal to the sum of the respective channel frequency and the intermediate frequency, each frequency determining network being connected by a switching diode to a common point in the local oscillator circuit such that when any one of the switching diodes is selectively forward biased by a D.C. current, the respective frequency determining circuit means will be activated in the oscillator circuit, and channel selector means for selectively forward biasing all of the switching diodes for the band-pass filter circuit means and the frequency determining network pertaining to each channel frequency.

12. A digital VHF television tuner for electronically selecting one of a plurality of channels, comprising in combination:

(a) a plurality of parallel connected band-pass filter circuit means, each respectively tuned to one of said channels;

(b) at least one input and at least one output signal translating means respectively coupled to the inputs and outputs of said band-pass filter circuit means;

(c) a plurality of parallel connected, solid state switching means respectively connecting each of said band-pass filter circuit means to said output signal translating means; and (d) channel selection means coupled to each of said switching means for selectively opening one of said switching means and closing the remaining switching means; wherein (e) when said selection means selectively open one of said switching means, the respective band-pass circuit means is operatively connected between said input and output signal translating means, thereby selectively coupling one of said channels to the input of said output signal translating means.

13. The digital VHF television tuner of claim 12 wherein said input and output signal translating means are respectively a transistor RF amplifier and a transistor IF amplifier.

14. The digital VHF television tuner of claim 12 wherein said parallel connected, solid state switching means are surface oriented PIN diodes.

15. The digital VHF television tuner of claim 14 wherein said channel selection means is a D.C. switch having a plurality of contacts, corresponding to said plurality of channels for selectively applying a D.C. forward bias voltage to said PIN diodes.

16. The digital VHF television tuner of claim 12 wherein:

(a) each of said band-pass filter circuit means include a transformer having primary and secondary windings tuned to the frequency of its respective channel; and wherein (b) said parallel connected, solid state switching means are surface oriented, PIN diodes; and wherein (c) a first group of said diodes are respectively connected between said input signal translating means and each of said primary windings, and a second group of said diodes are respectively connected between each of said secondary windings and said output signal translating means.

References Cited

UNITED STATES PATENTS

| | | | |
|---|---|---|---|
| 3,264,566 | 8/1966 | Kaufman | 325—459X |
| 2,596,117 | 5/1952 | Bell et al. | 325—462X |
| 3,354,397 | 11/1967 | Wittig | 325—453X |
| 3,204,207 | 8/1965 | Dewker | 325—468X |
| 3,167,730 | 1/1965 | Anderson et al. | 334—15 |

OTHER REFERENCES

G.E. Transistor Manual, page 449, TK 7872 T73 G4, 1964, published Aug. 25, 1964.

ROBERT L. RICHARDSON, Primary Examiner

U.S. Cl. X.R.

325—452; 334—15